(12) United States Patent
Li et al.

(10) Patent No.: US 11,374,002 B2
(45) Date of Patent: Jun. 28, 2022

(54) TRANSISTORS WITH HYBRID SOURCE/DRAIN REGIONS

(71) Applicant: GLOBALFOUNDRIES U.S. Inc., Santa Clara, CA (US)

(72) Inventors: Wenjun Li, Saratoga Springs, NY (US); Man Gu, Malta, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/937,821

(22) Filed: Jul. 24, 2020

(65) Prior Publication Data
US 2022/0028854 A1   Jan. 27, 2022

(51) Int. Cl.
  *H01L 27/088* (2006.01)
  *H01L 29/66* (2006.01)
  *H01L 29/78* (2006.01)
  *H01L 21/8234* (2006.01)

(52) U.S. Cl.
  CPC .. *H01L 27/0886* (2013.01); *H01L 21/823418* (2013.01); *H01L 21/823431* (2013.01); *H01L 29/66795* (2013.01); *H01L 29/7851* (2013.01)

(58) Field of Classification Search
  CPC ..... H01L 21/823418; H01L 21/823431; H01L 21/823814; H01L 21/823821; H01L 21/845; H01L 27/0886; H01L 27/0924; H01L 27/10879; H01L 27/1211; H01L 29/0843; H01L 29/0847; H01L 29/41791; H01L 29/66636; H01L 29/66659; H01L 29/66795; H01L 29/7835; H01L 29/7848; H01L 29/785; H01L 29/7851; H01L 29/7853; H01L 29/7855; H01L 29/78624; H01L 2029/7858
  See application file for complete search history.

(56) References Cited

U.S. PATENT DOCUMENTS 7,564,105 B2   7/2009  Chi et al.
2013/0049136 A1   2/2013  Wahl et al.
(Continued)

OTHER PUBLICATIONS

Wenjun Li et al., "Transistors With an Asymmetrical Source and Drain" filed Jan. 30, 2020 as U.S. Appl. No. 16/776,938.

*Primary Examiner* — David C Spalla
(74) *Attorney, Agent, or Firm* — Thompson Hine LLP; Anthony Canale

(57) ABSTRACT

Structures for a field-effect transistor and methods of forming a structure for a field-effect transistor. A semiconductor substrate includes a first region, a second region, and a first source/drain region in the first region. A semiconductor fin is located over the second region of the semiconductor substrate. The semiconductor fin extends laterally along a longitudinal axis to connect to the first region of the semiconductor substrate. The structure includes a second source/drain region including an epitaxial semiconductor layer coupled to the first semiconductor fin, and a gate structure that extends over the semiconductor fin. The gate structure includes a first sidewall and a second sidewall opposite the first sidewall, the first source/drain region is positioned adjacent to the first sidewall of the gate structure, and the second source/drain region is positioned adjacent to the second sidewall of the gate structure.

20 Claims, 11 Drawing Sheets

(56) References Cited

U.S. PATENT DOCUMENTS

2013/0234250 A1\* 9/2013 Lin ................. H01L 21/823437
257/355
2019/0006392 A1\* 1/2019 Liu .................... H01L 27/1211
2019/0237564 A1 8/2019 Jan et al.

\* cited by examiner

TRANSISTORS WITH HYBRID SOURCE/DRAIN REGIONS

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source region, a drain region, a channel region between the source region and drain region, and a gate electrode overlapped with the channel region. When a control voltage exceeding a characteristic threshold voltage is applied to the gate electrode, carrier flow occurs in the channel region between the source region and drain region to produce a device output current. A field-effect transistor may include multiple gates that overlap with multiple channel regions.

A fin-type field-effect transistor (FinFET) is a non-planar device structure that may be more densely packed in an integrated circuit than a planar field-effect transistor. A fin-type field-effect transistor may include a semiconductor fin, a gate structure that wraps about the semiconductor fin, and heavily-doped source and drain regions arranged on the semiconductor fin at opposite sides of the gate structure. The source and drain regions may be epitaxially grown in respective cavities that are etched in the semiconductor fin.

Multiple-gate field-effect transistors may use wide gate pitches for capacitance reduction. A problem associated with wide gate pitches in a multi-gate field-effect transistor is underfilling of the semiconductor material that is epitaxially grown in cavities to form the source and drain regions. The underfilling may degrade device performance, such as degradation of radio-frequency performance metrics like the power gain. The underfilling may also degrade other performance metrics. As examples, the drain current when the transistor is biased in the saturation region (Idsat) may be reduced and the contact resistance may be increased.

Improved structures for a field-effect transistor and methods of forming a structure for a field-effect transistor are needed.

SUMMARY

In an embodiment of the invention, a structure for a field-effect transistor is provided. The structure includes a semiconductor substrate having a first region, a second region, and a first source/drain region in the first region. A semiconductor fin is located over the second region of the semiconductor substrate. The semiconductor fin extends laterally along a longitudinal axis to connect to the first region of the semiconductor substrate. The structure includes a second source/drain region including an epitaxial semiconductor layer coupled to the first semiconductor fin, and a gate structure that extends over the semiconductor fin. The gate structure includes a first sidewall and a second sidewall opposite the first sidewall. The first source/drain region is positioned adjacent to the first sidewall of the gate structure, and the second source/drain region is positioned adjacent to the second sidewall of the gate structure.

In an embodiment of the invention, a method of forming a structure for a field-effect transistor is provided. The method includes forming a first source/drain region in a first region of a semiconductor substrate, forming a semiconductor fin over a second region of the semiconductor substrate, forming a second source/drain region including an epitaxial semiconductor layer coupled to the semiconductor fin, and forming a gate structure that extends over the semiconductor fin. The gate structure includes a first sidewall and a second sidewall opposite the first sidewall, and the semiconductor fin extends laterally along a longitudinal axis to connect to the first region of the semiconductor substrate. The first source/drain region is positioned adjacent to the first sidewall of the gate structure, and the second source/drain region is positioned adjacent to the second sidewall of the gate structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
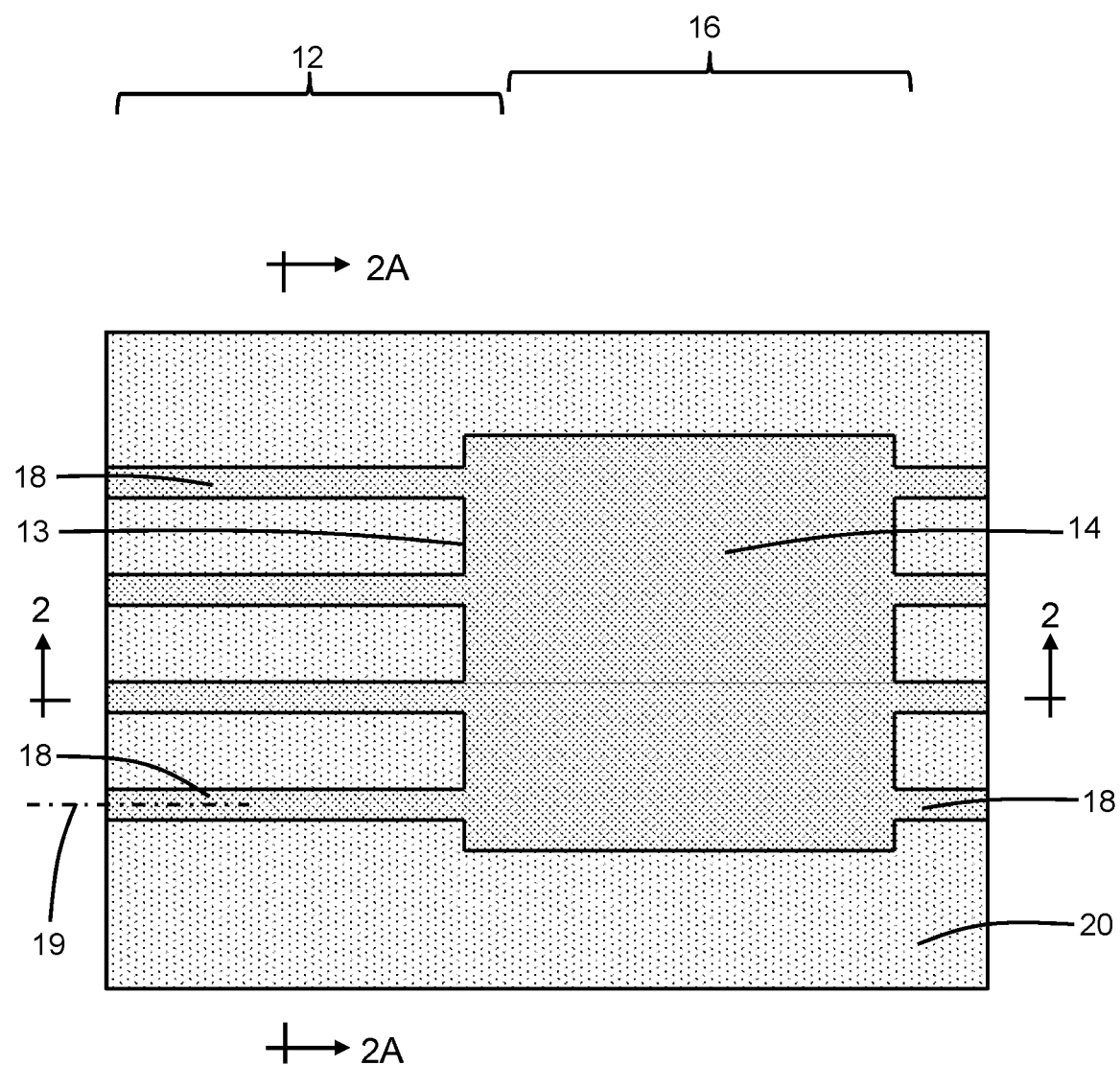
FIG. 1 is a top view of a structure for a field-effect transistor at an initial fabrication stage of a processing method in accordance with embodiments of the invention.
Figure 2:
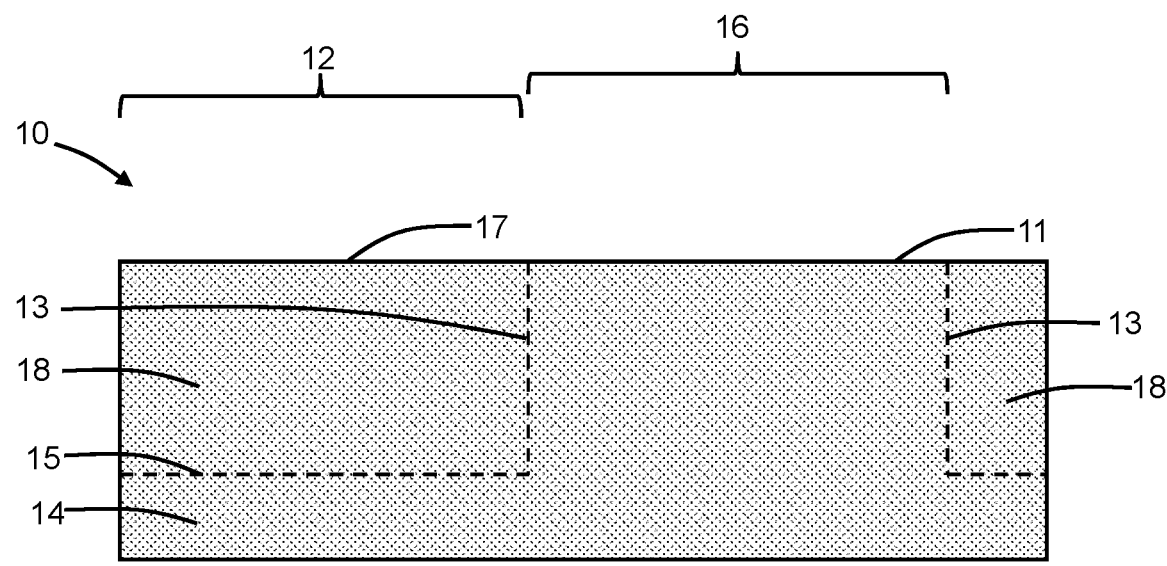
FIG. 2 is a cross-sectional view taken generally along line 2-2 in FIG. 1.
Figure 2A:
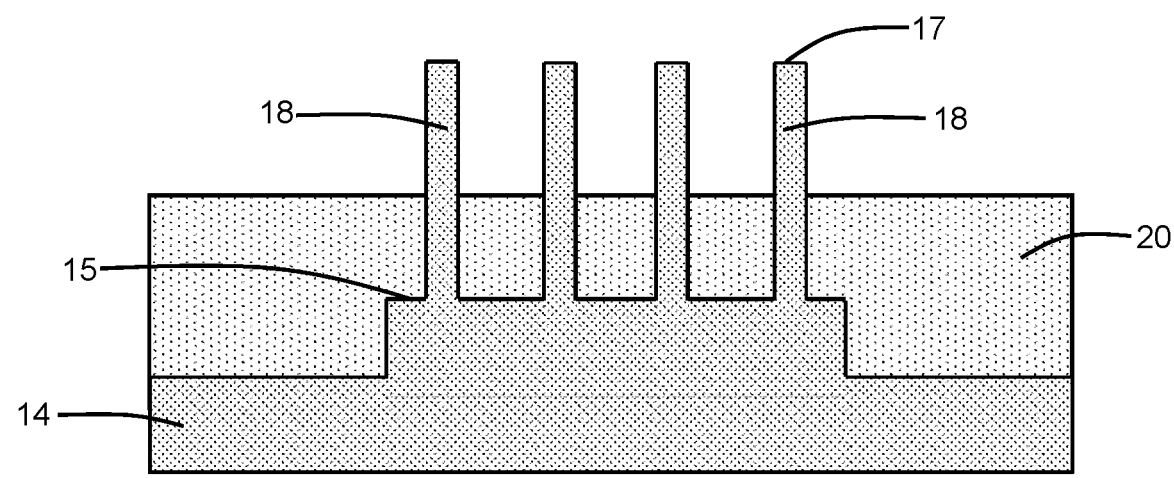
FIG. 2A is a cross-sectional view taken generally along line 2A-2A in FIG. 1.

With reference to FIGS. 1, 2, 2A and in accordance with embodiments of the invention, a structure 10 for a hybrid field-effect transistor includes a region 12 of a substrate 14, fins 18 that are arranged over, and project upwardly away from, the region 12 of the substrate 14, and a region 16 of the substrate 14 that provides a planar portion of the substrate 14 in which fins are absent. The substrate 14 and the fins 18 may be comprised of a single-crystal semiconductor material, such as single-crystal silicon. The fins 18 may be formed by patterning the substrate 14 with lithography and etching processes or by a self-aligned multi-patterning process. The region 16 of the substrate 14 is masked during the fin patterning.

The fins 18 may extend with a spaced-apart arrangement along their longitudinal axes 19 parallel or substantially parallel to each other. The fins 18 extend laterally along their longitudinal axes 19 to connect to different portions of a side surface 13 of the region 16 of the substrate 14. The different portions of the side surface 13 are spaced in a direction transverse to the longitudinal axes 19. The fins 18 have respective top surfaces 17 and are connected to a top surface 15 of the region 12 of the substrate 14. The region 16 of the substrate 14 has a top surface 11 that is located in a different plane than the top surface 15 of the region 12 of the substrate. The fins 18 have a height that is equal to the difference in elevation between their respective top surfaces 17 and the top surface 15 of the region 12 of the substrate 14. The height of the fins 18 may be equal to the difference in elevation between the top surface 11 of the region 16 of the substrate 14 and the top surface 15 of the substrate 14 in region 16 beneath the fins 18. The region 16 of the substrate 14 and the fins 18 may be coplanar or substantially coplanar at their respective top surfaces 11, 17.

Trench isolation regions 20 may surround a lower portion of each fin 18 and an upper portion of each fin 18 may be revealed above the trench isolation regions 20. The formation of the trench isolation regions 20 may include depositing a layer of a dielectric material, such as silicon dioxide, and recessing the dielectric layer to reveal the upper sections of the fins 18. The top surface 15 of the substrate 14 in region 12 is buried beneath the trench isolation regions 20 locally surrounding the fins 18. The trench isolation regions 20 surround the side surface 13 of the region 12 of the substrate 14.

Figure 3:
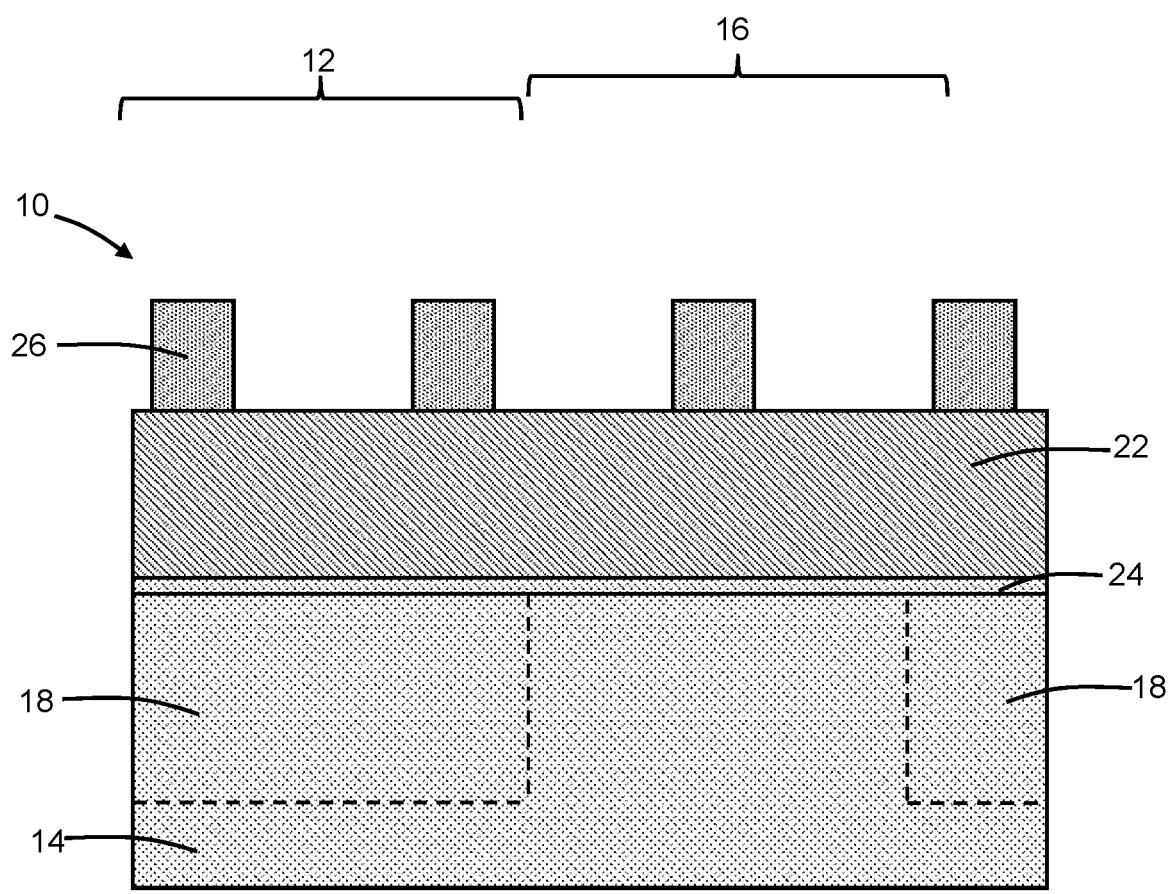
FIG. 3 is a cross-sectional view of the structure at a fabrication stage subsequent to FIG. 2.

With reference to FIG. 3 and at a fabrication stage subsequent to FIG. 2, a layer 22 of a material, such as polycrystalline silicon (i.e., polysilicon), and a layer 24 of a dielectric material, such as silicon dioxide, are successively formed over the substrate 14, fins 18, and trench isolation regions 20. The layer 22 may be deposited by chemical vapor deposition, and the layer 24 may be formed by an oxidation process. Hardmask sections 26 are formed that extend across the substrate 14 including region 16, the fins 18 in region 12, and the trench isolation regions 20. The hardmask sections 26 may be formed by patterning a layer of a dielectric material, such as silicon nitride, with lithography and etching processes. The hardmask sections 26 may be strips that have a parallel arrangement and a given uniform pitch. The hardmask sections 26 are aligned transverse to the respective longitudinal axes of the fins 18.

Figure 4:
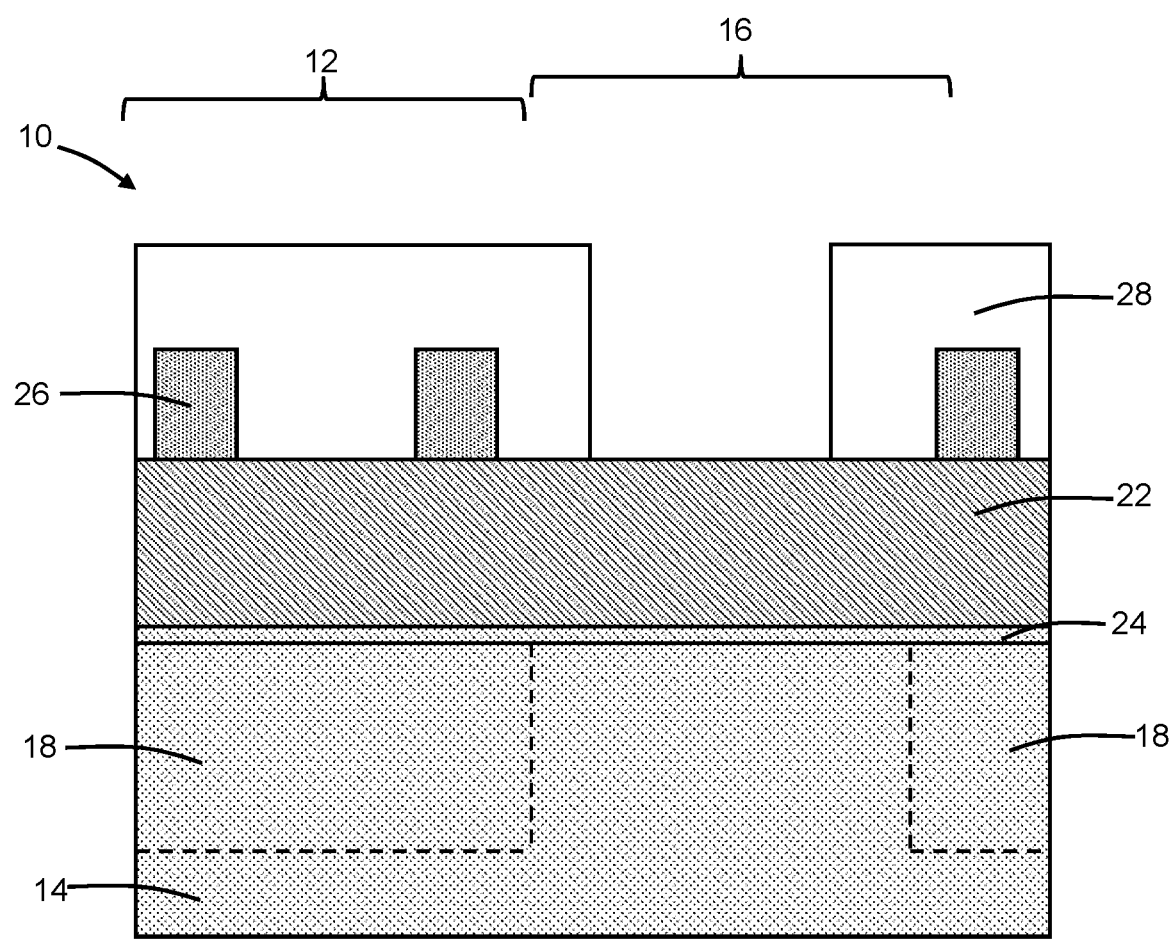
FIG. 4 is a cross-sectional view of the structure at a fabrication stage subsequent to FIG. 3.

With reference to FIG. 4 and at a fabrication stage subsequent to FIG. 3, at least one of the hardmask sections 26 is removed with a masked etching process. In the representative embodiment, only one of the hardmask sections 26 is removed with the masked etching process. To that end, a patterned etch mask 28 is formed that covers the hardmask sections 26 that are to be retained and that exposes the hardmask section 26 to be removed by the etching process. The etch mask 28 may include a layer of a spin-on hardmask material that is applied with the assistance of a spin-coating process and patterned with lithography and etching processes. The etching process may be a reactive ion etching process that removes the material of the hardmask section 26 selective to the material of the layer 22. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. The etch mask 28 is stripped following the removal of the exposed hardmask section 26.

The removal of the hardmask section 26 locally increases the pitch of the hardmask sections 26 in the region 16 of the substrate 14. The original pitch is retained in the adjacent region 12 of the substrate 14. In particular, the pitch is locally doubled in the region 16 of the substrate 14 by the removal of the hardmask section 26. The removal of additional hardmask sections 26 in region 16 of the substrate 14 can provide a further pitch increase, such as tripling the pitch resulting from the removal of an adjacent pair of the hardmask sections 26.

Figure 5:
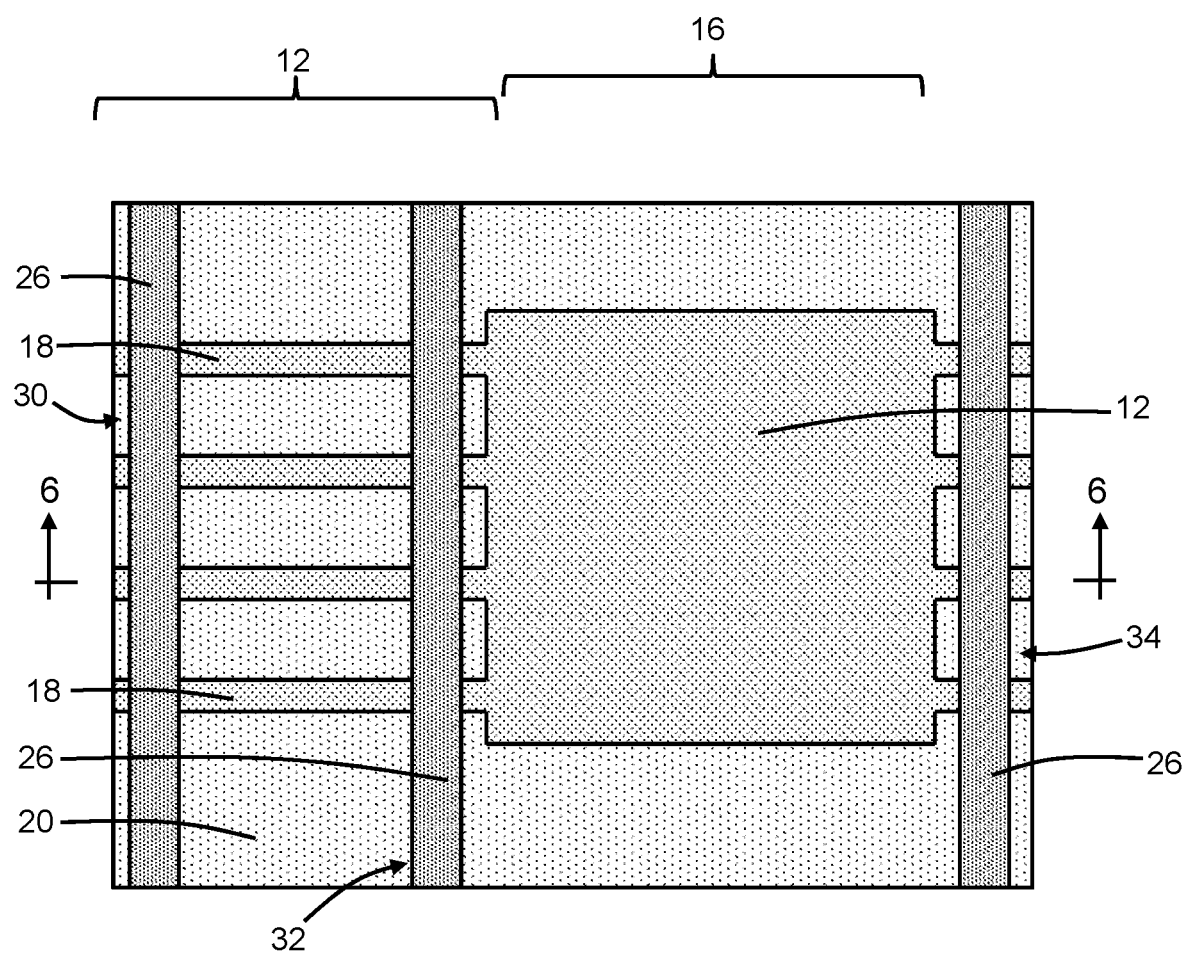
FIG. 5 is a top view of the structure at a fabrication stage subsequent to FIG. 4.
Figure 6:
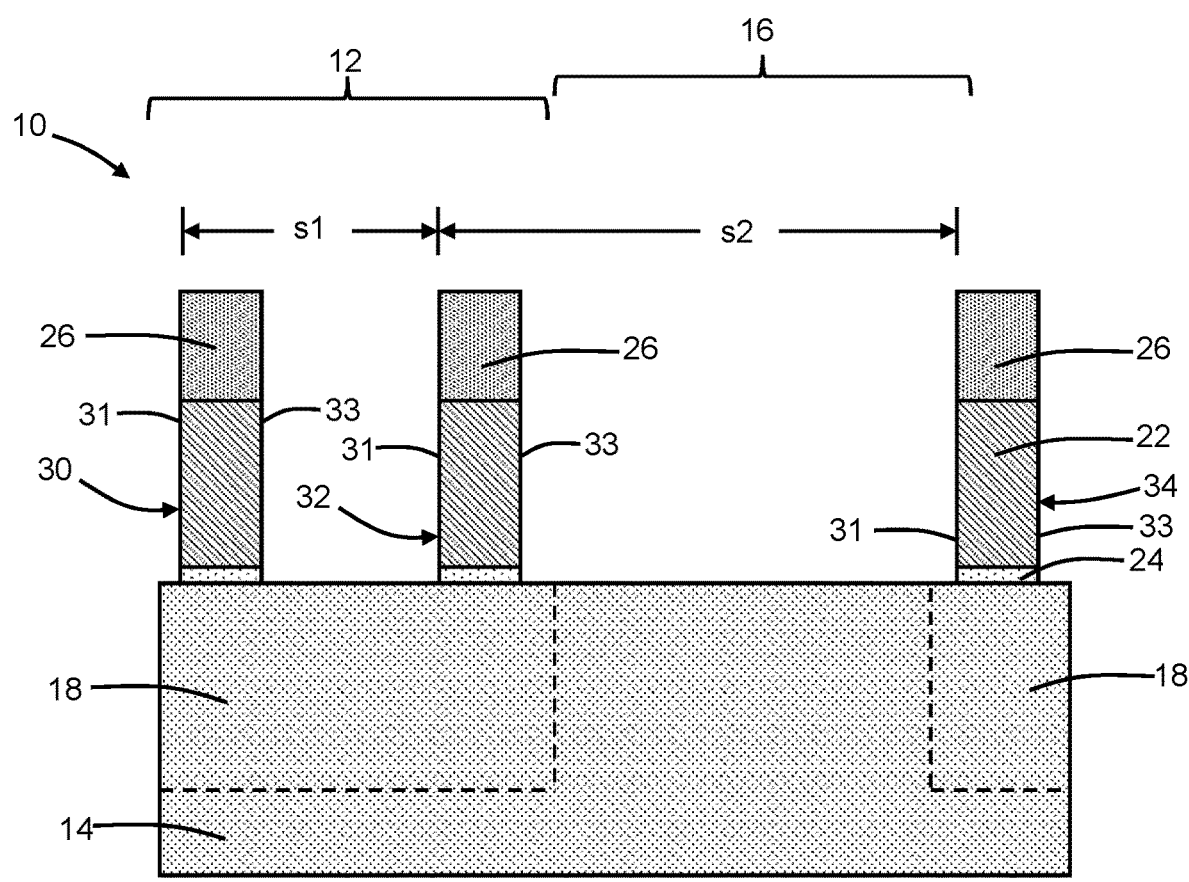
FIG. 6 is a cross-sectional view taken generally along line 6-6 in FIG. 5.

With reference to FIGS. 5, 6 in which like reference numerals refer to like features in FIG. 2 and at a subsequent fabrication stage, the layers 22, 24 are patterned to define multiple gate structures 30, 32, 34 that extend laterally along respective longitudinal axes over and across the fins 18. Each of the gate structures 30, 32, 34 is aligned transverse to the fins 18 and overlaps with, and wraps about, the fins 18. Each of the gate structures 30, 32, 34 has a sidewall 31 and a sidewall 33 that is opposite to the sidewall 31. The layer 22 may be patterned by an etching process, such as a reactive ion etching process, that is selective to the material of the layer 24 and that relies on the hardmask sections 26 as an etch mask and relies on the layer 24 as an etch stop. The layer 24 may be patterned by a separate selective etching process that relies on the hardmask sections 26 as an etch mask. Each of the gate structures 30, 32, 34 may include, as a layer stack, a dummy gate composed of the material of layer 22 and a dielectric layer composed of the material of layer 24. The hardmask sections 26 are arranged as gate caps over the gate structures 30, 32, 34.

The gate structures 30, 32, 34, which are ephemeral dummy elements, adopt the pattern, including the different pitches, of the hardmask sections 26. The result is that the sidewall 31 of the gate structure 30 and the sidewall 31 of the gate structure 32 are separated by a spacing, s1, and the sidewall 31 of the gate structure 32 and the sidewall 31 of the gate structure 34 are separated by a spacing, s2, that is greater than the spacing, s1. In an embodiment, the spacing, s2, may be equal or approximately equal to twice the spacing, s1. In such an embodiment, the gate structures 30, 32 may have a 1CPP (contacted (poly) pitch) gate pitch and the gate structures 32, 34 may have a 2CPP gate pitch. In other embodiments, the spacing, s2, may be equal or approximately equal to an integer multiple of the spacing, s1, with the integer multiple contingent upon the number of hardmask sections 26 removed from region 16. In an embodiment in which the integer is three (3) and the gate structure 34 is absent, the gate structure 32 and the gate structure (not shown) adjacent to the removed gate structure 34 may have a 3CPP gate pitch.

Figure 7:
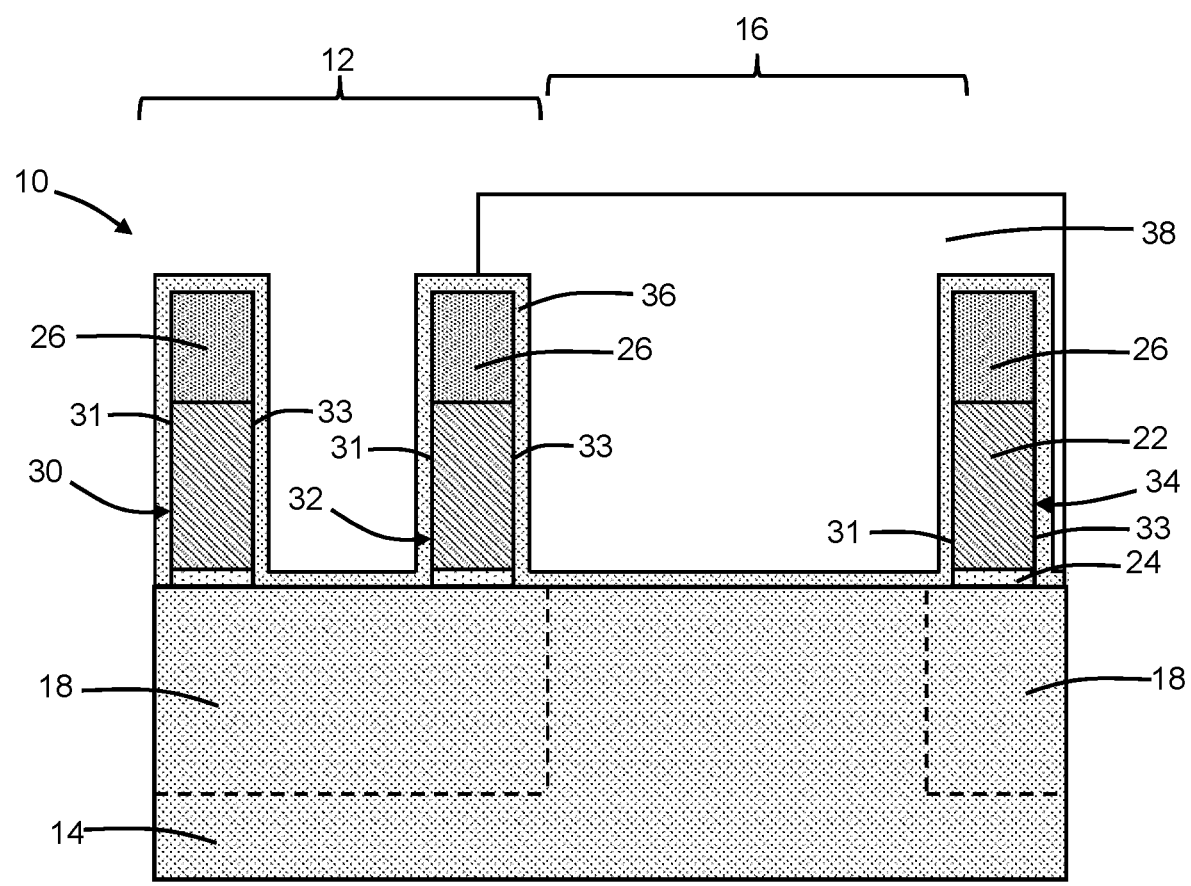
FIGS. 7-11 are cross-sectional views of the structure at successive fabrication stages subsequent to FIG. 6.

With reference to FIG. 7 in which like reference numerals refer to like features in FIG. 3 and at a subsequent fabrication stage, a conformal layer 36 composed of, for example, a low-k dielectric material is deposited as a liner over the substrate 14 in region 16, fins 18, and gate structures 30, 32, 34, by, for example, atomic layer deposition. The conformal layer 36 may have a uniform thickness that is independent or substantially independent of location.

A patterned etch mask 38 is formed that covers the conformal layer 36 in the region 16 of the substrate 14 between the gate structure 32 and the gate structure 34, and that exposes the conformal layer 36 in the region 12 of the substrate 14 between the gate structure 30 and the gate structure 32. The etch mask 38 may include a layer of a spin-on hardmask material that is applied with the assistance of a spin-coating process and patterned with lithography and etching processes.

Figure 8:
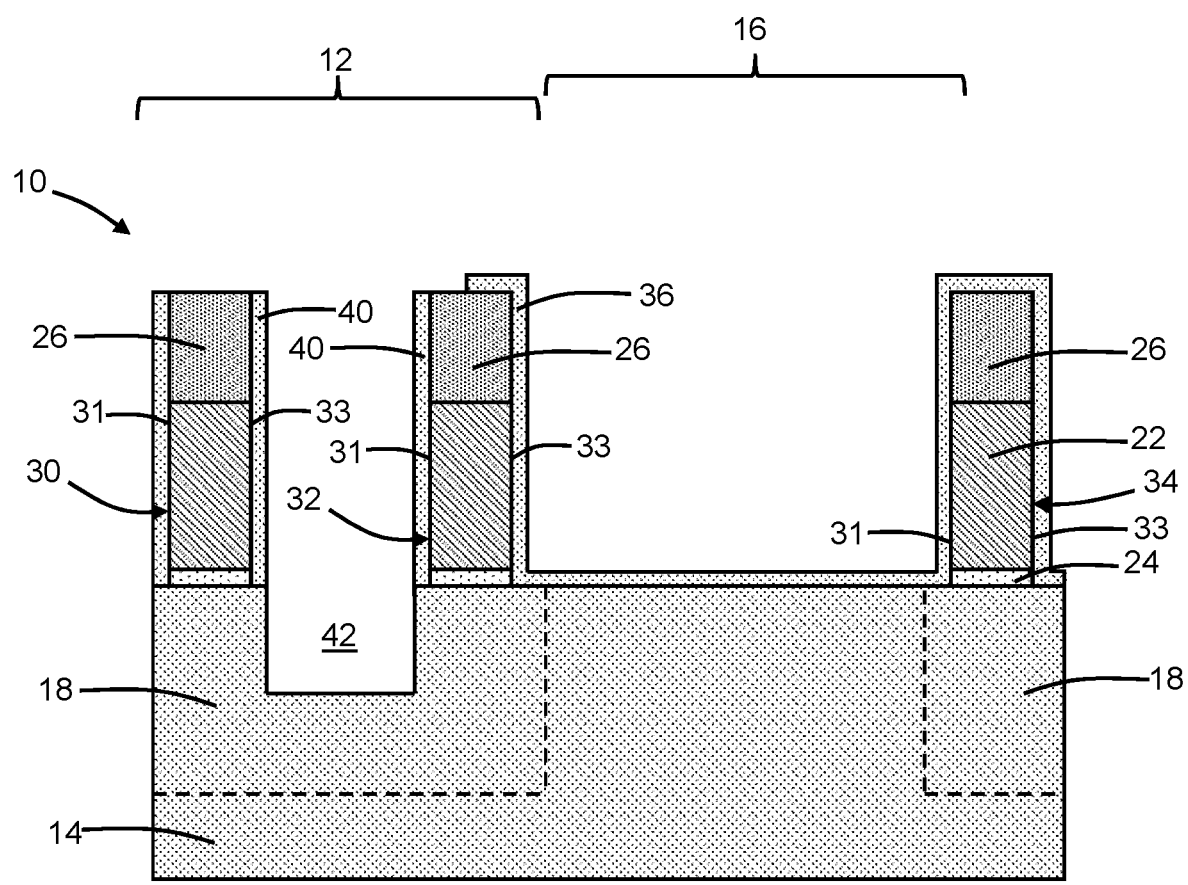

With reference to FIG. 8 in which like reference numerals refer to like features in FIG. 7 and at a subsequent fabrication stage, the conformal layer 36 is then etched with an anisotropic etching process, such as reactive ion etching, to define an opening in the conformal layer 36 that exposes a portion of each fin 18 between the gate structure 30 and the gate structure 32. The etching process also shapes the conformal layer 36 to form sidewall spacers 40 on the sidewalls 31, 33 of the gate structure 30 and the sidewall 31 of the gate structure 32. The etch mask 38 is stripped following the removal of the unmasked section of the conformal layer 36 and the formation of the sidewall spacers 40.

A cavity 42 is formed by an etching process, such as an anisotropic etching process (e.g., reactive ion etching), in the exposed portion of each fin 18 that is laterally between the gate structure 30 and the gate structure 32. The cavity 42 is laterally arranged in each fin 18 between the gate structure 30 and the gate structure 32. The etching process is self-aligned by the sidewall spacers 40. The conformal layer 36 masks the region 16 of the substrate 14 during the etching process.

Figure 9:
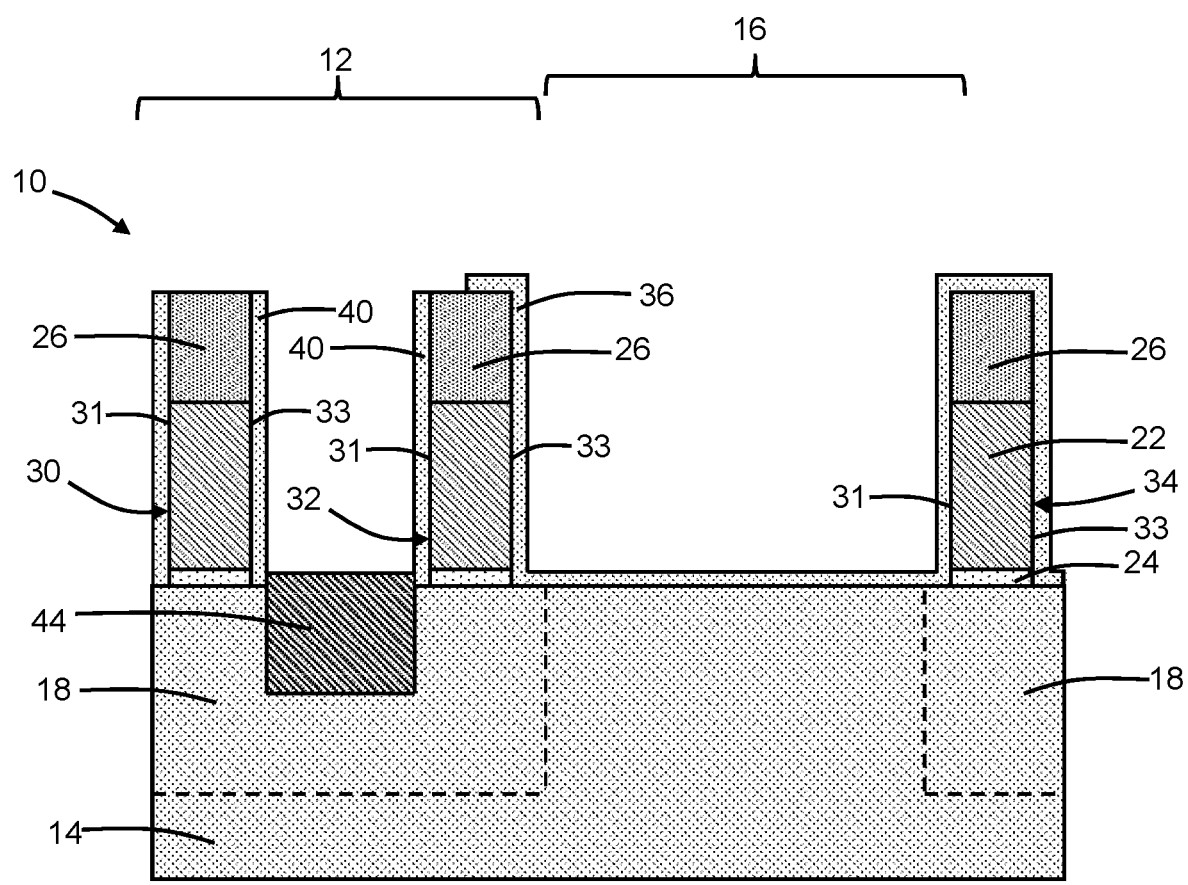

With reference to FIG. 9 in which like reference numerals refer to like features in FIG. 8 and at a subsequent fabrication stage, a layer 44 of an epitaxial semiconductor material is grown by an epitaxial growth process in sections from the surfaces bordering the cavity 42 in each fin 18. The sections of the layer 44 may extend laterally outward from the cavities 42 with a faceted shape and may merge in the spaces between the fins 18.

The epitaxial growth process forming the sections of the layer 44 may be selective in that the semiconductor material does not grow from dielectric surfaces, such as the hardmask sections 26, the conformal layer 36, and the sidewall spacers 40. The layer 44 may be in situ doped during epitaxial growth with a concentration of a dopant and may be heavily doped. The layer 44 is comprised of a semiconductor material having a different composition or a higher dopant concentration than the semiconductor material of the fins 18.

In an embodiment, the layer 44 may be in situ doped during epitaxial growth with a p-type dopant (e.g., boron) that provides p-type conductivity. In an alternative embodiment, the layer 44 may be in situ doped during epitaxial growth with an n-type dopant (e.g., phosphorus and/or arsenic) that provides n-type conductivity. The layer 44 may have a composition that contains germanium and silicon and, in an embodiment, the layer 44 may be comprised of silicon-germanium. In an embodiment, the layer 44 may be comprised of silicon-germanium and may contain a p-type dopant. In an embodiment, the layer 44 may be comprised of silicon. In an embodiment, the layer 44 may be comprised of silicon and may contain an n-type dopant.

Figure 10:
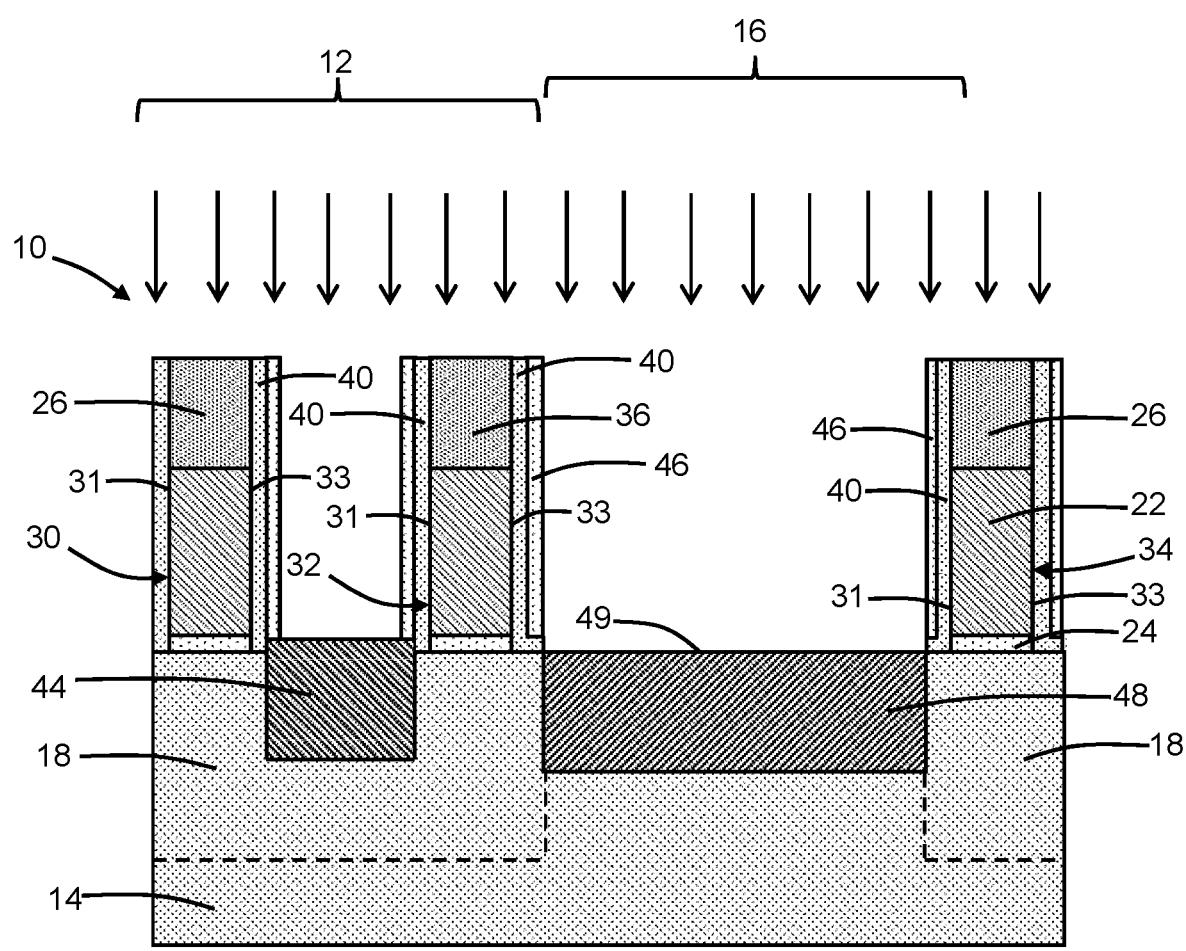

With reference to FIG. 10 in which like reference numerals refer to like features in FIG. 9 and at a subsequent fabrication stage, sidewall spacers 46 are formed on the sidewall spacers 40 and an etching process is subsequently used to remove the conformal layer 36 from the substrate 14 in region 16. The removal of the conformal layer 36 exposes the top surface 11 of the substrate 14 in region 16 and laterally between the gate structure 32 and the gate structure 34.

A doped region 48 may be formed in the region 16 of the substrate 14 between the gate structure 32 and the gate structure 34. The doped region 48 has a top surface 49 that may be coextensive with the top surface 11 (FIG. 2) of the substrate 14 and is arranged beneath the top surface 11 of the substrate 14. The doped region 48 contains a concentration of an n-type or p-type dopant, and the doped region 48 may be doped to have the same conductivity type as the layer 44. The semiconductor material of the doped region 48 has a different conductivity type than the semiconductor material of the substrate 14. For example, the doped region 48 may be doped with a concentration of an n-type dopant if the substrate 14 has p-type conductivity.

The doped region 48 may be formed by an ion implantation process that introduces energetic ions, as indicated diagrammatically by the single-headed arrows, with ion trajectories that stop over a depth range in the substrate 14. The ions may be generated from a suitable source gas and implanted into the substrate 14 with given implantation conditions using an ion implantation tool. The implantation conditions (e.g., ion species, dose, kinetic energy, tilt angle) may be selected to tune the characteristics (e.g., depth profile) of the doped region 48. The layer 44 is also implanted concurrently with the doped region 48. The implantation of the layer 44 may be used, for example, to adjust the junction profile.

In an embodiment, the doped regions 48 may be formed in the substrate 14 by implanting ions of a p-type dopant (e.g., boron) that provides p-type conductivity. In an alternative embodiment, the doped regions 48 may be concurrently formed in the substrate 14 by implanting ions of an n-type dopant (e.g., phosphorus and/or arsenic) that provides n-type conductivity. The gate structures 30, 32, 34 and sidewall spacers 40, 46 may function to self-align the ion-implantation process. The sidewall spacers 46 are removed following the implantation.

Figure 11:
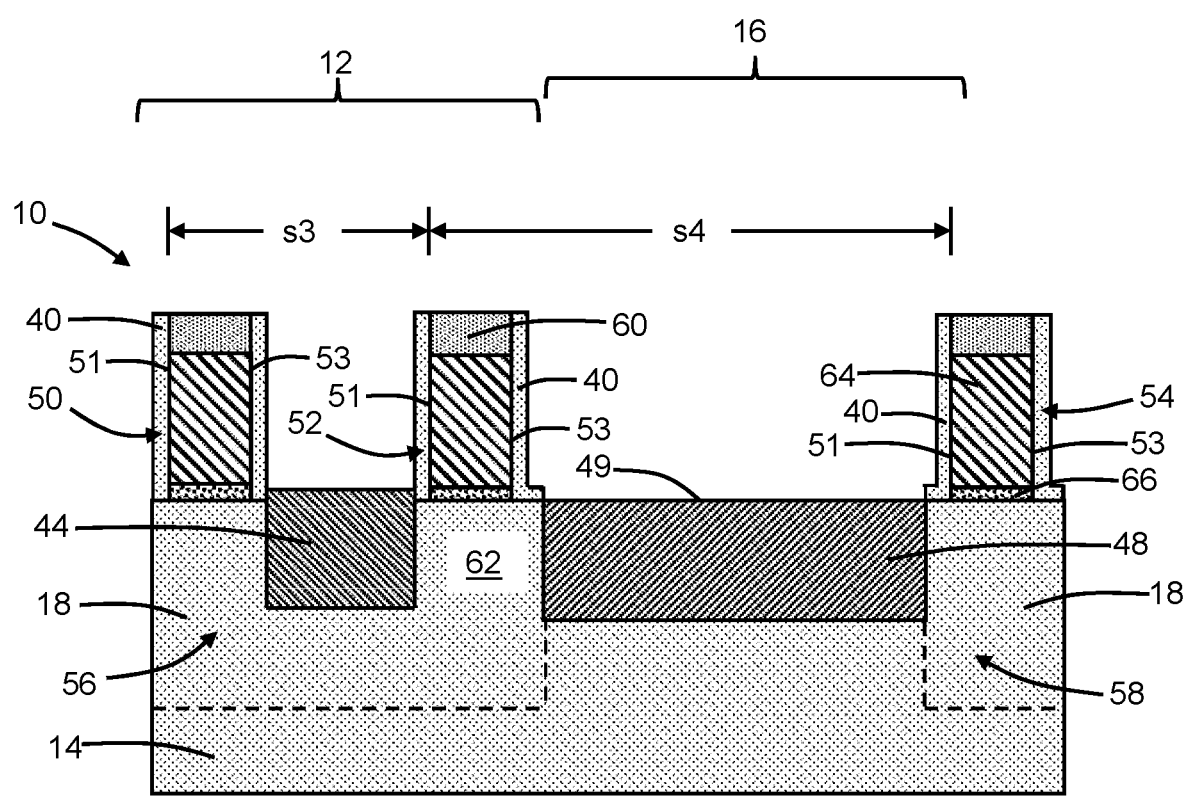

With reference to FIG. 11 in which like reference numerals refer to like features in FIG. 10 and at a subsequent fabrication stage, a replacement gate process is performed to replace the gate structures 30, 32, 34 with gate structures 50, 52, 54 and to complete the structure 10 for the field-effect transistor. The gate structures 50, 52, 54 may include a layer 64 comprised of one or more metal gate materials, such as work function metals, and a layer 66 comprised of a dielectric material, such as a high-k dielectric material like hafnium oxide. Each of the gate structures 50, 52, 54 has opposite side surfaces or sidewalls 51, 53. A gate cap 60 comprised of, for example, silicon nitride may be positioned over each of the gate structures 50, 52, 54.

The gate structures 50, 52, 54 adopt the pattern, including the multiple pitches, of the gate structures 30, 32, 34 as a result of the replacement gate process. In that regard, the gate structures 50, 52, 54 that extend laterally along respective longitudinal axes over and across the fins 18. Each of the gate structures 50, 52, 54 is aligned transverse to the fins 18 and overlaps with, and wraps about, the fins 18. The sidewall 51 of the gate structure 50 and the sidewall 51 of the gate structure 52 are separated by a spacing, s3, and the sidewall 51 of the gate structure 52 and the sidewall 51 of the gate structure 54 are separated by a spacing, s4, that is greater than the spacing, s3. In an embodiment, the spacing, s4, may be equal or approximately equal to twice the spacing, s3. In such an embodiment, the gate structures 50, 52 may be positioned with a 1CPP gate pitch, and the gate structures 52, 54 may be positioned with a 2CPP gate pitch. In other embodiments, the spacing, s4, may be equal or approximately equal to an integer multiple of the spacing, s3, contingent upon the number of adjacent hardmask sections 26 that were removed prior to forming the dummy gates. In an embodiment in which the integer is three (3) and two dummy gates are removed, the gate structure 54 is absent, and the gate structure 52 and a gate structure (not shown) adjacent to the gate structure 52 may be positioned with a 3CPP gate pitch.

The structure 10 is a hybrid structure includes an embedded source/drain region 56 provided by the merged sections of the layer 44 and a non-embedded source/drain region 58 provided by the doped region 48. As used herein, the term "source/drain region" means doped semiconductor material that can function as either a source or a drain of a field-effect transistor. The source/drain region 56 is positioned laterally between the gate structure 50 and the gate structure 52, and the source/drain region 58 is positioned laterally between the gate structure 52 and the gate structure 54. The source/drain region 58 is located in a planar region 16 of the substrate 14 and is provided without the presence of either fins or epitaxially-grown semiconductor material, in contrast to the source/drain region 56 that include both. That is, the source/drain region 58 lacks either fins or epitaxial semiconductor material and resembles a source/drain region found in a planar field-effect transistor. A channel region 62 is disposed in each fin 18 laterally between the source/drain region 56 and the source/drain region 58 and vertically beneath the overlying gate structure 52.

In an embodiment, the source/drain region 56 may provide a source in the structure 10 for the field-effect transistor, and the source/drain region 58 may provide a drain in the structure 10 for the field-effect transistor. In an alternative embodiment, the source/drain region 56 may provide a drain in the structure 10 for the field-effect transistor, and the source/drain region 58 may provide a source in the structure 10 for the field-effect transistor. The source/drain regions 56, 58 are doped to have a conductivity type of the same polarity (i.e., the same conductivity type).

Middle-of-line processing and back-end-of-line processing follow, which includes formation of contacts, vias, and wiring for an interconnect structure that is coupled with the field-effect transistor.

A field-effect transistor with the source/drain region 56 providing the source and the source/drain region 58 may exhibit improved radio-frequency performance. The larger gate pitch (e.g., 2CPP) and the planar design of source/drain region 58, which may be arranged on the drain side of the field-effect transistor, may reduce the capacitance in comparison with a conventional field-effect transistor having a 1CPP gate pitch on the drain side. The source/drain region 58 may exhibit a lower resistance on the drain side in comparison with a conventional fin-type field-effect transistor in which the source/drain region on the drain side contains underfilled epitaxial semiconductor material. The structure 10 may include additional gate structures characterized by the varied gate pitches, and the source/drain regions 56, 58 may be repeated to form a multi-gate field-effect transistor for use in a radio-frequency integrated circuit.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a semiconductor substrate including a first region, a second region, and a first source/drain region in the first region;
   a first semiconductor fin over the second region of the semiconductor substrate, the first semiconductor fin extending laterally along a longitudinal axis to connect to the first region of the semiconductor substrate;
   a second source/drain region including an epitaxial semiconductor layer coupled to the first semiconductor fin; and
   a first gate structure that extends over the first semiconductor fin, the first gate structure including a first sidewall and a second sidewall opposite the first sidewall,
   wherein the first source/drain region is positioned adjacent to the first sidewall of the first gate structure, the second source/drain region is positioned adjacent to the second sidewall of the first gate structure, and the first source/drain region lacks epitaxial semiconductor material.

2. The structure of claim 1 further comprising:
   a second gate structure that extends over the first semiconductor fin, the second gate structure including a sidewall adjacent to the first sidewall of the first gate structure,
   wherein the first source/drain region is laterally positioned between the first gate structure and the second gate structure.

3. The structure of claim 2 further comprising:
a third gate structure that extends over the first semiconductor fin, the third gate structure including a sidewall adjacent to the second sidewall of the first gate structure,
wherein the second source/drain region is laterally positioned between the first gate structure and the third gate structure.

4. The structure of claim 3 wherein the first sidewall of the first gate structure and the sidewall of the second gate structure are separated by a first spacing, the first sidewall of the first gate structure and the sidewall of the third gate structure are separated by a second spacing, and the first spacing is greater than the second spacing.

5. The structure of claim 4 wherein the first spacing is equal to an integer multiple of the second spacing.

6. The structure of claim 4 wherein the first spacing is equal to two times the second spacing.

7. The structure of claim 1 wherein the first source/drain region is a drain of the field-effect transistor, and the second source/drain region is a source of the field-effect transistor.

8. The structure of claim 1 wherein the first region of the semiconductor substrate includes a side surface, and the first semiconductor fin is connected to a first portion of the side surface of the first region of the semiconductor substrate.

9. The structure of claim 8 further comprising:
a second semiconductor fin connected to a second portion of the side surface of the first region of the semiconductor substrate,
wherein the epitaxial semiconductor layer of the second source/drain region is further coupled to the second semiconductor fin.

10. The structure of claim 1 wherein the first region of the semiconductor substrate includes a first surface, the second region of the semiconductor substrate includes a second surface, the first source/drain region is arranged beneath the first surface, and the first semiconductor fin extends away from the second surface.

11. The structure of claim 10 wherein the second surface is located in a different plane than the first surface.

12. The structure of claim 10 wherein the epitaxial semiconductor layer of the second source/drain region is positioned in a cavity in the first semiconductor fin, the first semiconductor fin has a top surface spaced from the second surface of the semiconductor substrate, and the top surface of the first semiconductor fin is substantially coplanar with the first surface of the semiconductor substrate.

13. A structure for a field-effect transistor, the structure comprising:
a semiconductor substrate including a first region, a second region, and a first source/drain region in the first region;
a semiconductor fin over the second region of the semiconductor substrate, the semiconductor fin extending laterally along a longitudinal axis to connect to the first region of the semiconductor substrate;
a second source/drain region including an epitaxial semiconductor layer coupled to the semiconductor fin; and
a gate structure that extends over the semiconductor fin, the gate structure including a first sidewall and a second sidewall opposite the first sidewall,
wherein the first source/drain region lacks semiconductor fins, the first source/drain region is positioned adjacent to the first sidewall of the gate structure, and the second source/drain region is positioned adjacent to the second sidewall of the gate structure.

14. The structure of claim 1 wherein the first source/drain region is a portion of the semiconductor substrate, and the epitaxial semiconductor layer and the portion of the semiconductor substrate each contain a dopant of a given conductivity type.

15. A method of forming a structure for a field-effect transistor, the method comprising:
forming a first source/drain region in a first region of a semiconductor substrate;
forming a semiconductor fin over a second region of the semiconductor substrate;
forming a second source/drain region including an epitaxial semiconductor layer coupled to the semiconductor fin; and
forming a first gate structure that extends over the semiconductor fin,
wherein the first gate structure includes a first sidewall and a second sidewall opposite the first sidewall, the semiconductor fin extends laterally along a longitudinal axis to connect to the first region of the semiconductor substrate, the first source/drain region is positioned adjacent to the first sidewall of the first gate structure, the second source/drain region is positioned adjacent to the second sidewall of the first gate structure, the first source/drain region is formed a portion of the semiconductor substrate by ion implantation, and the epitaxial semiconductor layer of the second source/drain region is formed by an epitaxial growth process.

16. The method of claim 15 wherein the first region of the semiconductor substrate includes a side surface, and the semiconductor fin is connected to a first portion of the side surface of the first region of the semiconductor substrate.

17. The method of claim 16 further comprising:
forming a second semiconductor fin connected to a second portion of the side surface of the first region of the semiconductor substrate,
wherein the epitaxial semiconductor layer of the second source/drain region is further coupled to the second semiconductor fin.

18. The method of claim 15 wherein the first region of the semiconductor substrate includes a first surface, the second region of the semiconductor substrate includes a second surface, the first source/drain region is arranged beneath the first surface, and the semiconductor fin extends away from the second surface.

19. The method of claim 18 wherein the epitaxial semiconductor layer of the second source/drain region is positioned in a cavity in the semiconductor fin, the semiconductor fin has a top surface spaced from the second surface of the semiconductor substrate, and the top surface of the semiconductor fin is substantially coplanar with the first surface of the semiconductor substrate.

20. The structure of claim 13 wherein the first source/drain region is a portion of the semiconductor substrate, and the epitaxial semiconductor layer and the portion of the semiconductor substrate each contain a dopant of a given conductivity type.

* * * * *

UNITED STATES PATENT AND TRADEMARK OFFICE
CERTIFICATE OF CORRECTION

PATENT NO. : 11,374,002 B2
APPLICATION NO. : 16/937821
DATED : June 28, 2022
INVENTOR(S) : Wenjun Li and Man Gu Page 1 of 1

It is certified that error appears in the above-identified patent and that said Letters Patent is hereby corrected as shown below:

In the Claims

Column 10, Claim 15, Line 29 reads:
"source/drain region is formed a portion of the semi-"
It should read:
-- source/drain region is formed in a portion of the semi- --

Signed and Sealed this
Fourth Day of March, 2025

Coke Morgan Stewart
*Acting Director of the United States Patent and Trademark Office*